United States Patent
Rijks

(10) Patent No.: US 7,034,630 B2
(45) Date of Patent: Apr. 25, 2006

(54) BALUN TRANSFORMER AND TRANSCEIVER

(75) Inventor: Theodoor Gertrudis Silvester Maria Rijks, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 28 days.

(21) Appl. No.: 10/497,336

(22) PCT Filed: Dec. 2, 2002

(86) PCT No.: PCT/IB02/05088

§ 371 (c)(1),
(2), (4) Date: Jun. 1, 2004

(87) PCT Pub. No.: WO03/049288

PCT Pub. Date: Jun. 12, 2003

(65) Prior Publication Data

US 2005/0040910 A1    Feb. 24, 2005

(30) Foreign Application Priority Data

Dec. 6, 2001 (EP) ................................. 01204724

(51) Int. Cl.
*H01P 5/10* (2006.01)

(52) U.S. Cl. ........................................ 333/26; 333/246

(58) Field of Classification Search ................. 333/25, 333/26, 246
See application file for complete search history.

(56) References Cited

U.S. PATENT DOCUMENTS

| | | | | |
|---|---|---|---|---|
| 5,697,088 A | | 12/1997 | Gu | 455/307 |
| 5,886,589 A | * | 3/1999 | Mourant | 333/26 |
| 6,018,277 A | * | 1/2000 | Vaisanen | 333/26 |
| 6,483,415 B1 | * | 11/2002 | Tang | 336/200 |

FOREIGN PATENT DOCUMENTS

GB    2254195 A    *    9/1992

* cited by examiner

*Primary Examiner*—Dean Takaoka

(57) ABSTRACT

The invention relates to a balun transformer for converting an unbalanced signal into a balanced signal or vice versa and having a bandpass characteristic for bandpass filtering the signal being converted. Such balanced transformers are substantially known in the art and comprise a first electronic circuit for transceiving the unbalanced signal and a second electronic circuit for transceiving the balanced signal wherein the first and the second electronic circuit are non-galvanically coupled via coupling elements. It is the object of the present invention to reduce the size of such known balun transformer. This object is achieved by embodying both electronic circuits as individual resonance circuits 100-1, 100-2 being operated at their individual resonance frequencies representing the centre frequencies of the bandpass filter characteristic. Each of the individual resonance frequencies is preferably set-up by adjusting a tuning unit (110, 120) and/or at least one dimension of the coupling element (CPL1, CPL2) of its co-ordinated resonance circuit (100-1, 100-2) under the consideration that the length of each of the coupling elements (CPL1, CPL2) must be shorter than λ/4. The invention further relates to a transceiver 400 comprising such a balun transformer 100.

7 Claims, 3 Drawing Sheets

BALUN TRANSFORMER AND TRANSCEIVER

The invention relates to a balun transformer for converting an unbalanced signal into a balanced signal or vice versa according to the preamble of claim 1. The balun transformer has a bandpass characteristic for bandpass-filtering the signal being converted.

FIG. 3 shows an equivalent circuit diagram of a balun transformer illustrating the correlation between an unbalanced signal and a balanced signal. The unbalanced signal U is typically related to ground whereas the balanced signal is characterized as a differential signal U/2−(−U/2).

The invention further relates to a transceiver known in the art and shown in FIG. 4. The transceiver 400 comprises an antenna element 410 for transmitting the unbalanced signal in a transmitting mode or for receiving an unbalanced signal in a receiving mode.

The transceiver 400 further comprises at least one balun transformer 420 for receiving the unbalanced signal from the antenna element 410 and for converting it into a balanced signal for the radio frequency RF-transceiver unit 430 in the receiving mode. In the transmitting mode the balun transformer 420 serves for converting a balanced signal into the unbalanced signal to be output to the antenna element 410.

Finally, the receiver 400 includes a radio frequency RF-transceiver unit 430 for receiving and further processing the balanced signal provided by the balun transformer 420 in the receiving mode. In the transmitting mode said RF-transceiver 430 serves for providing the balanced signal to the balun transformer 420. The balun transformer 420 in connection to the RF-transceiver unit 430 is also referred to as front end module.

Such Balun transformers and transceivers are generally known in the art, e.g. from the patent U.S. Pat. No. 5,697,088. The balun transformer disclosed therein is shown in FIG. 5. having the reference numeral 420'. It comprises two quarter wave couplers 202 and 204. Each of said couplers comprises a first and a second electronic circuit. More specifically, in the first quarter wave coupler 202 the first coupling element 206 and the capacitors $C_{p2}$, $C_{s2}$ form the first electronic circuit whereas the second coupling element 208 and the capacitors $C_{s1}$, $C_{p1}$ form the second electronic circuit. In the first quarter wave coupler 202 these electronic circuits are non-galvanically coupled via the first and the second coupling element 206 and 208. The name quarter wave coupler indicates that the length of each of the first and the second coupling element 206 and 208 are adjusted to λ/4, with λ representing the wavelength of the signal to be converted by the balun transformer 420'. Due to the adjustment of the length of the coupling elements 206 and 208 to λ/4 these coupling elements are themselves individually operated at their resonance frequency. The capacitors $C_{s2}$ and $C_{p2}$ in the first electronic circuit and the capacitors $C_{s1}$ and $C_{p1}$ are not used to operate the first or the second electronic circuit as a whole at their individual resonance frequencies but only serve for controlling the frequency selectivity of a bandpass filter function provided by said balun transformer.

The balun transformer 420' transceives the unbalanced signal at port 1 and transceives the balanced signal between ports 2 and 3.

Disadvantageously, the design of the balun transformer disclosed in the patent U.S. Pat. No. 5,697,088 is quite large, in particular due to the adjustment of the length of the coupling elements to λ/4. For example, at a frequency of 1 GHz the length of the coupling elements 206 and 208 are approximately 2,5 cm for a substrate having a dielectric constant of 10.

Starting from that prior art it is the object of the present invention to provide a balun transformer the size of which is reduced.

This object is solved by subject matter of claim 1. More specifically, starting from the balun transformer known in the art this object is achieved in the way that both the first and the second electronic circuit are embodied as individual resonance circuits being operated at their individual resonance frequencies representing the centre frequencies of the bandpass filter characteristic, respectively, in that each of the individual resonance frequencies is set-up by adjusting the tuning unit and/or at least one dimension of the coupling element of its co-ordinated resonance circuit under the consideration that the length of each of the coupling elements must be shorter than λ/4 with λ representing the wavelength of the signal to be converted and/or by adjusting the spacing between the coupling elements of said two resonance circuits.

The dimension of a coupling elements means e.g. its length and/or its width.

The claimed embodiment of the balun transformer enables a considerable reduction of the size of the balun transformer in comparison to the prior art. This is substantially achieved by embodying the length of the coupling element in each resonance circuit considerably shorter than λ/4. By embodying the length of the coupling elements like that, the coupling elements are not operated at their individual resonance frequency with the result that their dimensions can freely be selected in a wide range; in particular their lengths can be adjusted to meet with predetermined size or space requirements.

The adjustment of the individual resonance frequencies of the first and the second resonance (electronic) circuit is done by adjusting the tuning unit and/or the length of the coupling elements under the consideration that it must be considerably shorter than λ/4.

Advantageously, the size of the balun transformer circuit according to the present invention is not only reduced by the described shortening of the length of the coupling elements but also by the fact that the balun transformer according to the present invention comprises only one coupler represented by the first and the second resonance circuit, whereas in the prior art, e.g. in the U.S. Pat. No. 5,697,088 two couplers are required.

According to a first embodiment the first and the second coupling elements are embodied as strip lines which—for coupling—are arranged in parallel and adjacent to each other laying in the same plane.

Alternatively, those coupling elements are embodied as spiral inductors the cross sections of which overlap at least partly.

Further embodiments of the balun transformer are subject matter of the dependent claims.

The above identified object of the present invention is further solved by a transceiver according to claim 7. The advantages of said transceiver comply with the advantages mentioned above with respect to the balun transformer.

The description is accompanied by 5 figures, wherein

FIG. 1 shows an embodiment of the balun transformer according to the invention;

FIG. 2a+b show the frequency and the phase characteristic of the band pass filter characteristic of the balun transformer according to the invention;

The balun transformer according to the invention will now be described by referring to FIGS. 1 and 2.

Figure 1:
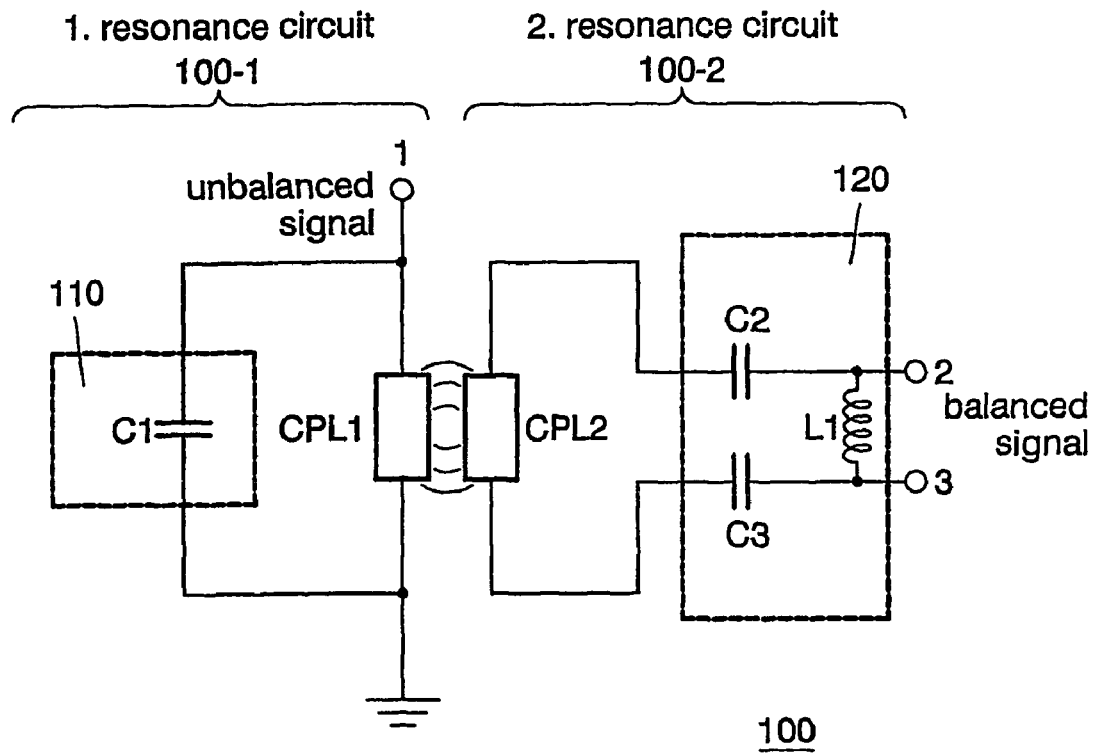

FIG. 1 shows the hardware configuration of a balun transformer according to the invention. The balun transformer 100 comprises a first 100-1 and a second 100-2 resonance circuit. The first resonance circuit, 100-1 serves for transceiving an unbalanced signal whereas the second resonance circuit 100-2 serves for transceiving a balanced signal. The first resonance circuit 100-1 comprises a first tuning unit 110 which is embodied as first capacitor C1 and which is connected in parallel to a first coupling element CPL1. Both, the first capacitor C1 and the first coupling element CPL1 are connected to ground.

The second resonance circuit 100-2 comprises a second coupling element CPL2 and a second tuning unit 120. Said tuning unit 120 comprises a second capacitor C2 being connected with one end two a second coupling element CPL2, a third capacitor C3 being with one end connected to the other end of said second coupling element CPL2 and a coil L1 for connecting those ends of the second and the third capacitor C2, C3 which are not connected to the second coupling element CPL2.

The balun transformer 100 transceives the unbalanced signal at port 1 and transceives the balanced signal between ports 2 and 3.

The first, 100-1 and the second, 100-2 resonance circuit are preferably non-galvanically coupled via their first and second coupling elements CPL1 and CPL2.

During the operation of the balanced transformer 100 both resonance circuits 100-1 and 100-2 are operated at their individual resonance frequencies. The resonance frequency $f_{R1}$ of the first resonance circuit 100-1 is set-up by adjusting the tuning unit 110, i.e. the capacitor C1, and/or the length of the coupling element CPL1 under consideration that it must be shorter then λ/4 with , representing the wavelength of the signal to be converted. Similarly, the resonance frequency $f_{R2}$ of the second resonance circuit 100-2 is set-up by adjusting the tuning unit 120, i.e. capacitors C2, C3 and/or the inductor L1, and/or the length of the coupling element CPL2. The resonance frequencies $f_{R1}$, $f_{R2}$ of both resonance circuits 100-1 and 100-2 are further slightly influenced by the embodiment of the coupling between the first and the second coupling element CPL1, CPL2. More specifically, the resonance frequencies of both circuits are influenced—in the case that they are embodied as striplines—by the individual widths of the striplines and the space there-between or—in the case that the coupling elements CPL1, CPL2 are embodied as spiral conductors—by the amount of the area of the overlapping cross sections of the spiral conductors.

Preferably, for achieving optimal frequency selectively the resonance frequency $f_{R1}$ of the first resonance circuit 100-1 and the resonance frequency $f_{R2}$ of the second resonance circuit 100-2 are identical.

Figures 2A, 2B:
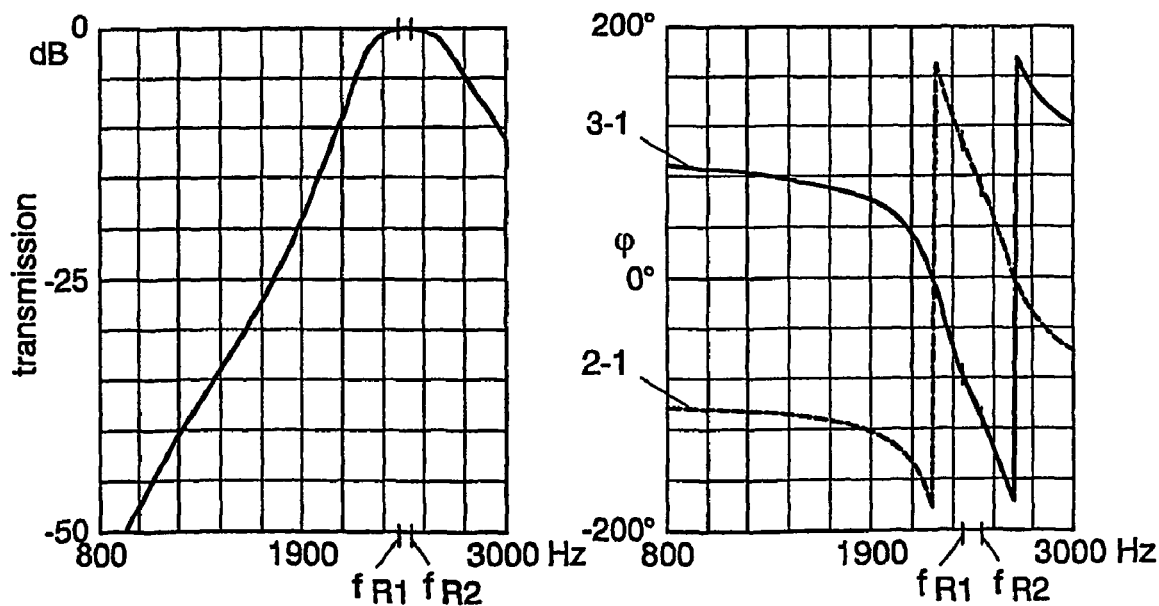
Figure 3:
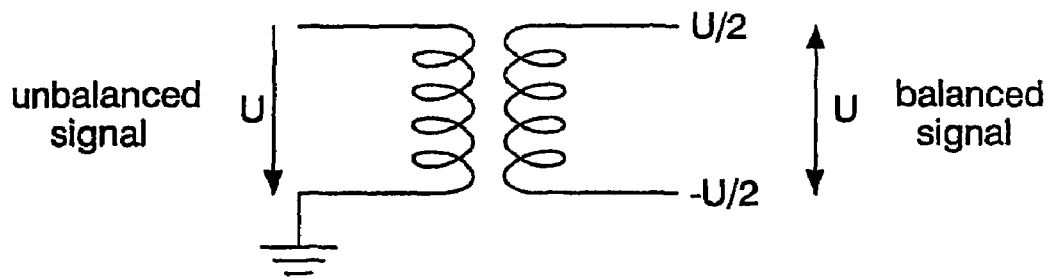
FIG. 3 shows a schematic equivalent circuit diagram of a balun transformer to illustrate its operation.

The bandpass filter characteristic of a balun transformer according to the invention is shown in FIG. 2. FIG. 2a shows a filter frequency characteristic whereas FIG. 2b shows a phase characteristic. From FIG. 2a it can be seen that the balun transformer 100 has a bandpass characteristic selecting only those frequencies of transceived signals which are close to the resonance frequencies of the first, 100-1 and the second, 100 2 resonance circuit. Expressed in other words, according to the bandpass characteristic, frequencies which are below the minimum of the said two frequencies and which are above the maximum of those frequencies are blocked.

FIG. 2b shows the phase characteristic of the balanced signal. Curve 2-1 shows the phase characteristic of the signal being converted from port 1 to port 2 or vice versa; the phase characteristic 3-1 belongs to the signal being converted from port 1 to port 3 or vice versa. There is always a phase difference of 180 degree between the two phase characteristics 2-1 and 3-1 as it is essential for a balun transformer.

Figure 4:
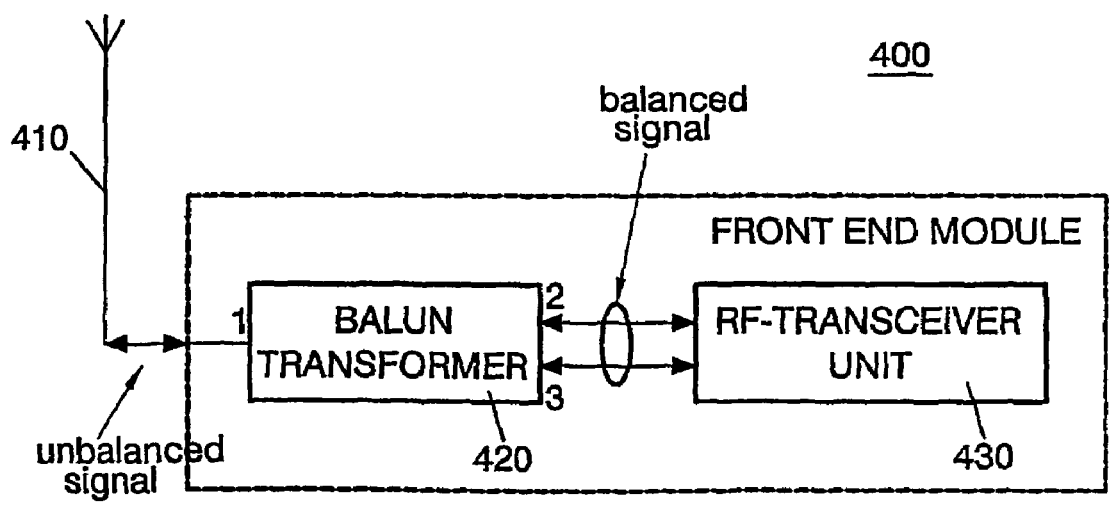
FIG. 4 shows a transceiver known in the art.
Figure 5:
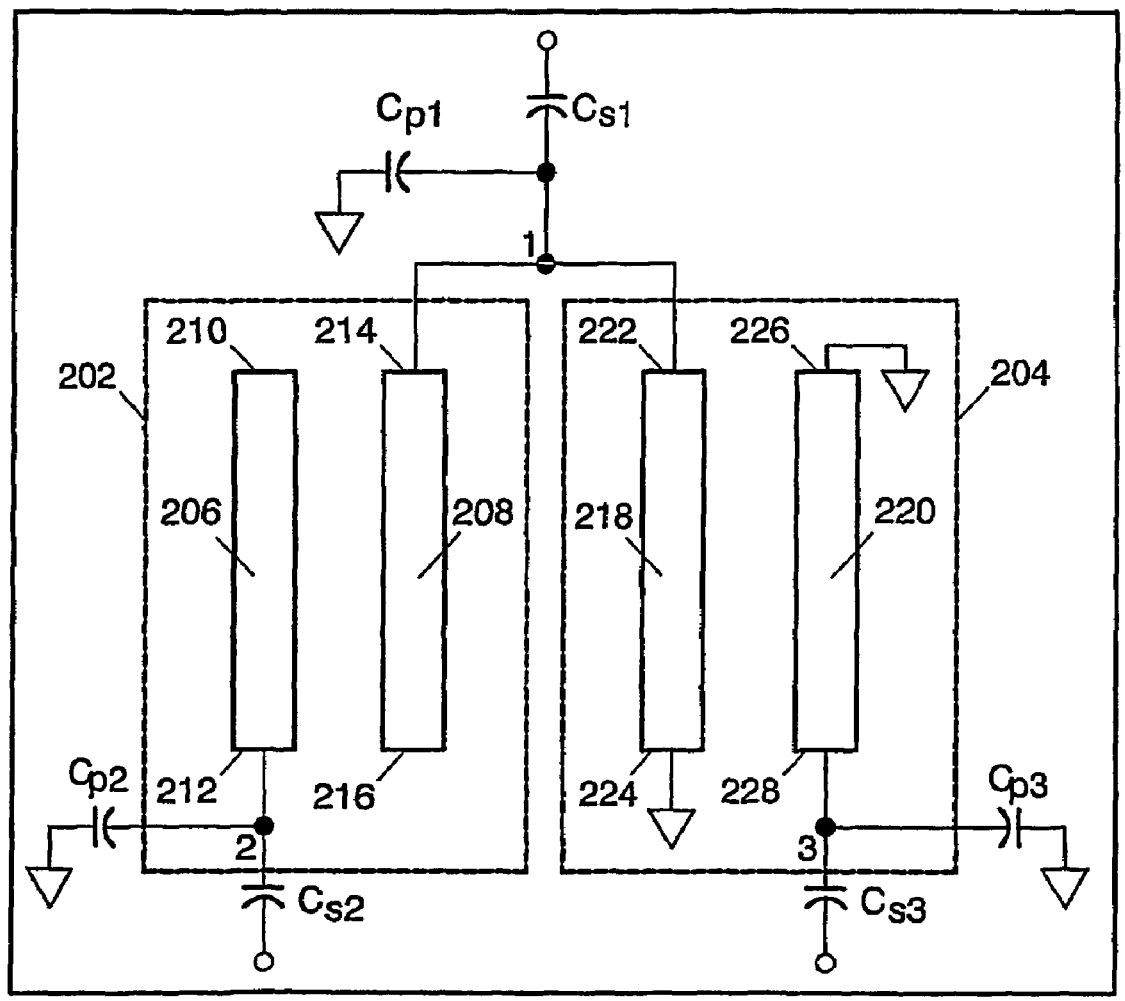
FIG. 5 shows a balun transformer known in the art.

The embodiment of the transceiver according to the present invention substantially corresponds to the configuration shown in FIG. 4 under the consideration that the balun transformer 420 is embodied according to the invention that means for example like shown in FIG. 1.

The invention claimed is:

1. Balun transformer (100) for converting an unbalanced signal into a balanced signal or vice versa and having a bandpass characteristic for bandpass-filtering the signal being converted, comprising:

a first electronic circuit, including a first tuning unit (110) being connected to a first coupling element (CPL1), for transceiving the unbalanced signal; and a second electronic circuit, including a second tuning unit (120) being connected to a second coupling element (CPL2), for transceiving the balanced signal; wherein the first and the second electronic circuit are coupled via the first and the second coupling element (CPL1, CPL2); characterized in that both the first and the second electronic circuit are embodied as individual resonance circuits (100-1, 100-2) being operated at their individual resonance frequencies $f_{R1}$, $f_{R2}$ representing the centre frequencies of the bandpass filter characteristic, respectively;

each of the individual resonance frequencies is set-up by adjusting the tuning unit (110, 120) and/or at least one dimension of the coupling element (CPL1, CPL2) of its co-ordinated resonance circuit (100-1, 100-2) under the consideration that the length of each of the coupling elements (CPL1, CPL2) must be shorter than λ/4 with λ representing the wavelength of the signal to be converted and/or by adjusting the spacing between the coupling elements (110, 120) of said two resonance circuits; and the resonance frequencies set up in the first and second resonance circuit (100-1, 100-2) are identical and represent one single centre frequency of the bandpass filter characteristic.

2. The balun transformer (100) according to claim 1, characterized in that the first tuning unit (110) is embodied as first capacitor (C1) and connected in parallel to the first coupling element (CPL1), both the first capacitor (C1) and the first coupling element (CPL1) are connected between ground and an unbalanced signal port (1) for transceiving the unbalanced signal at said port (1); and the second tuning unit (120) comprises a second capacitor (C2) being with one end connected to the second coupling element (CPL2), a third capacitor (C3) being with one end connected to the other end of the second coupling element (CPL2) and a coil (L1) connecting those ends of the second and the third capacitor (C2, C3) which are not connected to the second coupling element (CPL2), wherein those ends form balanced signal ports (2, 3), respectively, for transceiving the balanced signal there between.

3. The balun transformer (100) according to claim 1, characterized in that both the first and the second coupling element (CPL1, CPL2) are embodied as striplines of limited lengths which are—for coupling being—arranged in parallel and adjacent to each other lying in the same plane.

4. The balun transformer (100) according to claim 1, characterized in that the dimension of the coupling element (CPL1, CPL2) is represented by its length and/or its width.

5. The balun transformer (100) according to claim 1, characterized in that both the first and the second coupling elements (CPL1, CPL2) are embodied as spiral inductors.

6. The balun transformer (100) according to claim 1, characterized in that the balun transformer (100) is—as far as possible—embodied in thin-film technology.

7. Transceiver (400) comprising:
an antenna element (410) for—in a transmitting mode—transmitting an unbalanced signal or for—in a receiving mode—receiving an unbalanced signal;
at least one balun transformer (100) according to claim 1 for receiving the unbalanced signal from the antenna element (410) and converting it into a balanced signal in the receiving mode or for converting a balanced signal into the unbalanced signal to be output to the antenna element in the transmitting mode; and
a RF-transceiver unit (430) for receiving and further processing the balanced signal from the balun transformer (100) in the receiving mode or for transmitting the balanced signal to the balun transformer (100) in the transmitting mode.

* * * * *